(12) United States Patent
Stadlbauer et al.

(10) Patent No.: US 10,331,810 B2
(45) Date of Patent: Jun. 25, 2019

(54) METHOD FOR DETERMINING A MODEL OF AN OUTPUT QUANTITY OF A TECHNICAL SYSTEM

(71) Applicant: AVL LIST GMBH, Graz (AT)

(72) Inventors: Markus Stadlbauer, Vienna (AT); Stefan Jakubek, Vienna (AT); Maxime Deregnaucourt, Vienna (AT); Andreas Rainer, Kainbach bei Graz (AT); Herbert Lanschützer, Graz (AT); Karl Zettel, Übelbach (AT); Nico Didcock, Wolfsgraben (AT); Christoph Hametner, Vienna (AT)

(73) Assignee: AVL List GmbH, Graz (AT)

( * ) Notice: Subject to any disclaimer, the term of this patent is extended or adjusted under 35 U.S.C. 154(b) by 461 days.

(21) Appl. No.: 14/784,171

(22) PCT Filed: May 20, 2014

(86) PCT No.: PCT/EP2014/060350
§ 371 (c)(1),
(2) Date: Oct. 13, 2015

(87) PCT Pub. No.: WO2014/187828
PCT Pub. Date: Nov. 27, 2014

(65) Prior Publication Data
US 2016/0063151 A1    Mar. 3, 2016

(30) Foreign Application Priority Data
May 22, 2013 (AT) .............................. A 50347/2013

(51) Int. Cl.
*G06F 17/10* (2006.01)
*G06F 17/50* (2006.01)
(Continued)

(52) U.S. Cl.
CPC ....... *G06F 17/5009* (2013.01); *G05B 13/041* (2013.01); *G05B 17/02* (2013.01); *G06F 17/16* (2013.01)

(58) Field of Classification Search
CPC .................................................. G06F 17/5009
(Continued)

(56) References Cited

FOREIGN PATENT DOCUMENTS

| JP | 2003044827 A | 2/2003 |
|---|---|---|
| JP | 2012247855 A | 12/2012 |
| WO | 2012163972 | 12/2012 |

OTHER PUBLICATIONS

M. Stadlbauer et al., "Online Measuring Method Using . . . Stimulation and Modelling," IEEE Conference Publications, 2012, pp. 1314-1419.
(Continued)

*Primary Examiner* — Hugh M Jones
(74) *Attorney, Agent, or Firm* — Dykema Gossett PLLC

(57) ABSTRACT

To determine a model for an output quantity (y) of a technical system that is dependent in a nonlinear manner on a number of input quantities in the form of an input quantity vector (u), a target output quantity range (COR) is defined and a model-based experimental design is determined with which the model is parameterized in the target output quantity range (COR) through the selection of associated input quantity vectors ($u_{cand,COR}$). A distance-based selection criterion is used for the selection of the input quantity vectors ($u_{cand,COR}$).

19 Claims, 5 Drawing Sheets

Figure 1:
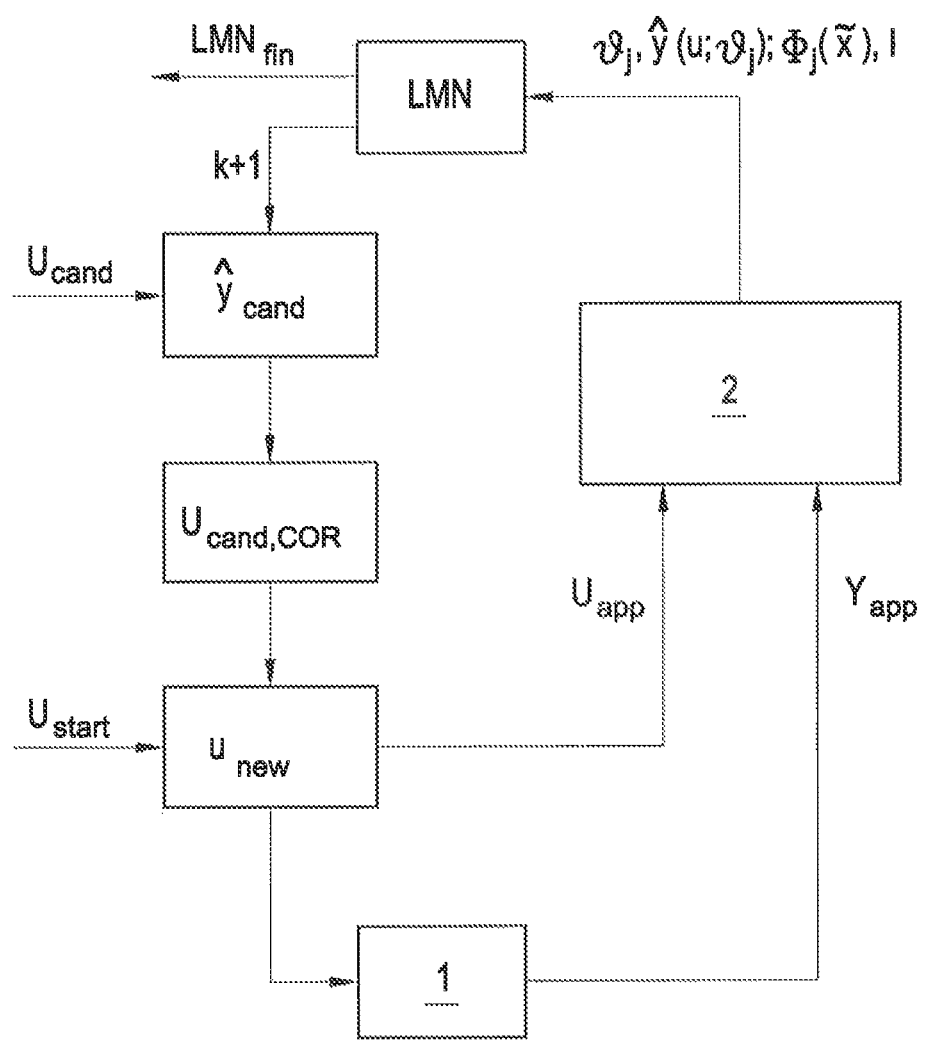

(51) Int. Cl.
*G05B 13/04* (2006.01)
*G05B 17/02* (2006.01)
*G06F 17/16* (2006.01)

(58) Field of Classification Search
USPC .......................................................... 703/2
See application file for complete search history.

(56) References Cited

OTHER PUBLICATIONS

B. Hartmann et al., "Model-Based Design . . . Low Noise Levels," IEEE Conference Publications, 2011, pp. 5306-5311.
V. Picheny et al., "Adaptive Designs of Experiments for Accurate Approximation of a Target Region," J. Mech. Design, vol. 132, Jul. 2010, pp. 071008-1 to 071008-9.
C. Hametner et al., "Local model network identification for online engine modelling," Information Sciences 220 (2013), pp. 210-225.

METHOD FOR DETERMINING A MODEL OF AN OUTPUT QUANTITY OF A TECHNICAL SYSTEM

The present invention relates to a method for determining a model for an output quantity of a technical system that is dependent in a nonlinear manner on a number of input quantities in the form of an input quantity vector, a model structure with model parameters being given beforehand as a model, and the model parameters being optimized on the technical system in an iterative method on the basis of measured output quantities from bench tests, and the bench tests following an experimental design that is prepared for each iteration step from estimated output quantities of the model.

The output quantities of many technical systems are multi-dimensionally nonlinear and dependent on a multitude of parameters. One typical example is a combustion engine in which many characteristics (output quantities), such as $NO_x$ emissions, soot in the exhaust, consumption, etc., are dependent on a wide variety of input quantities (or operating points), such as engine speed, torque, temperature, position of the swirl flap, fuel pressure, etc. In general, a technical system is understood as being a system in which a number of certain input quantities, such as settings of actuators, for example, bring about a number of certain output quantities, such as characteristics or quantities that can be measured by sensors, for example, meaning that a functional relationship exists between the input and output quantities. In the development of such technical systems, it is very tedious to perform the development exclusively on a bench, since it is hardly possible to manually optimize the many nonlinear output quantities that are dependent on one another and on different input quantities, which is a possible aim of development. For this reason, it has already been attempted to emulate such technical systems or certain output quantities as a function of input quantities and system parameters by means of mathematical models by means of which it is possible to simulate and study the influence of input quantity variations or model parameter variations and to make optimizations that are then verified on the bench, for example. For this purpose, so-called model-based methods (model-based design of experiments) have become known, for example from WO 2012/163 972 A1, that identify a model of a nonlinear technical system on the basis of a mathematical method and of measured values. A model structure is selected, e.g., a known local model network (LMN) or a known multilayer perceptron (MLP), and the model parameters are estimated on the basis of data obtained from bench tests (online). The model iteratively generates output quantities that are used in an experimental design in order to generate new input quantities for the next iteration step that are checked on the bench for the technical system. The output quantities of the bench tests are then used in consideration of certain basic conditions in order to improve the model parameters. This is repeated until a predetermined abort criterion has been met, i.e., until the model parameters have been estimated with sufficient accuracy. It is important for the estimation of the model parameters that the experimental design cover the entire range of dynamics and the entire output range of the technical system in order to achieve sufficient model quality in the overall output range.

However, many characteristics of a technical system are only of interest in certain ranges, whether because there are legal requirements that impose specifications on characteristics in certain parameter ranges or because a characteristic is only meaningful in certain parameter ranges. One typical example of this is the $NO_x$ or soot emissions of a combustion engine, which must stay within thresholds dictated by the legislature in certain operating ranges. A model for such a characteristic would therefore only have to be precise within this target output range but not for the entire possible output range.

However, the method for model-based model identification according to WO 2012/163 972 A1 produces a model that is valid for the entire output range, which is associated with high cost, particularly for the necessary bench tests. On the other hand, it may be that the model does not yield sufficiently precise results precisely in the target output range because too few training data in the target output range were used during model identification. Therefore, such a model would also only be of use for this target output range under certain conditions.

A method is known from Picheny, V., et al., "Adaptive Designs of Experiments for Accurate Approximation of a Target Region," Journal of Mechanical Design, Vol. 132, July 2010, 071008-1 to 071008-9, in which an experimental design is created, whereby a meta-model estimates output quantities in the vicinity of a narrow target range as precisely as possible. A Kriging model is used as the model, and the target range is defined as a contour line. The model is therefore intended to estimate a contour line very well but not within a larger target output range, for which this method is not suited. A sequential design of experiments model is used in which a new input quantity is selected according to an optimization criterion as a function of already known input quantities and their associated calculated output quantities. This method thus dispenses with bench tests. The goal of this method is therefore also not optimization on the basis of concrete measured values from bench tests on the real system, but rather more the adaptation of a function to a predetermined contour line.

It is an object of the present invention to provide a method for determining a model for an output quantity of a technical system in which bench tests are used for optimization, the method making do with as little expense as possible for bench tests, and the estimated model having a high level of accuracy in a large target output range.

This object is achieved by determining a number of output quantities from a set of input quantity vectors using the model valid for the current iteration step, determining from this set of output quantities the target input quantity vectors that lead to an output quantity within a predetermined target output quantity range, selecting a new input quantity vector to supplement the set of input quantity vectors from the certain target input quantity vectors for the next iteration step, the new input quantity vector being selected on the basis of a predetermined distance-based selection criterion, using the set of selected input quantity vectors enlarged in this way as an experimental design in order to generate measured data of the output quantity by means of bench tests with which the model is optimized, and repeating the above method steps iteratively until a predetermined abort criterion is met. By virtue of this method, the model is trained in a targeted manner in a defined target output quantity range while requiring fewer bench tests for this and nonetheless enabling a very high level of accuracy to be achieved in the target output quantity range.

Worthy of consideration as a distance-based selection criterion is a criterion in the input quantity range, in the output quantity range or in the input/output quantity range.

The use of a local model network has proven to be especially expedient as a model structure, since it requires little computing time, enables the use of existing knowledge of the technical system, and leads to model parameters that can be used in a robust manner for the experimental design.

The present invention is explained in further detail below with reference to FIGS. 1 to 10, which show exemplary, schematic and non-limiting advantageous embodiments of the invention.

Figure 2:
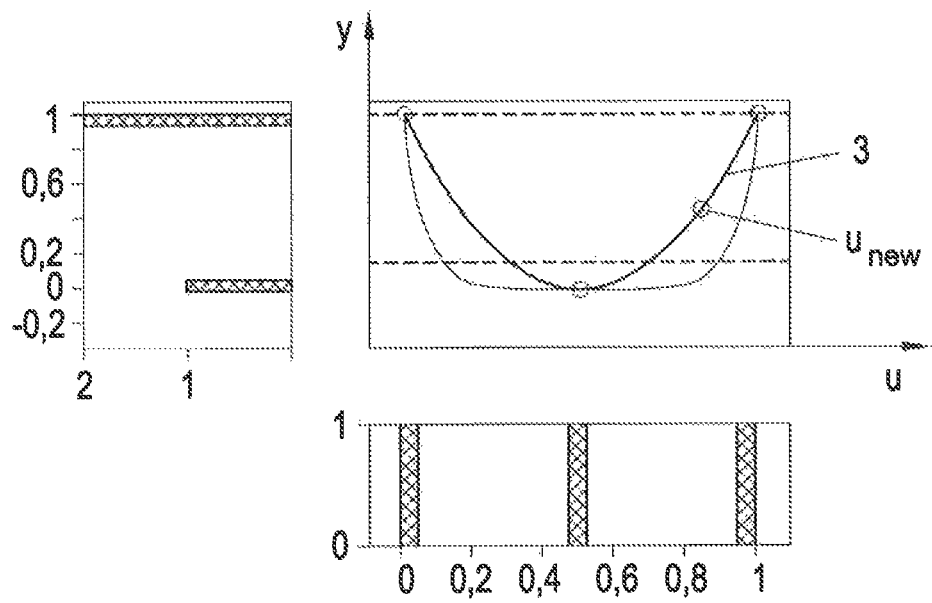
Figure 3:
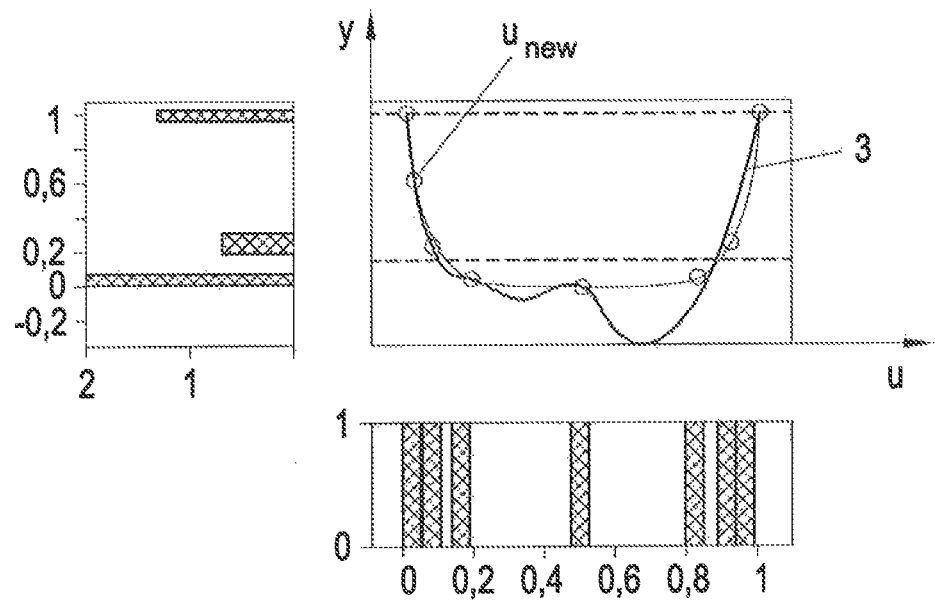
Figure 4:
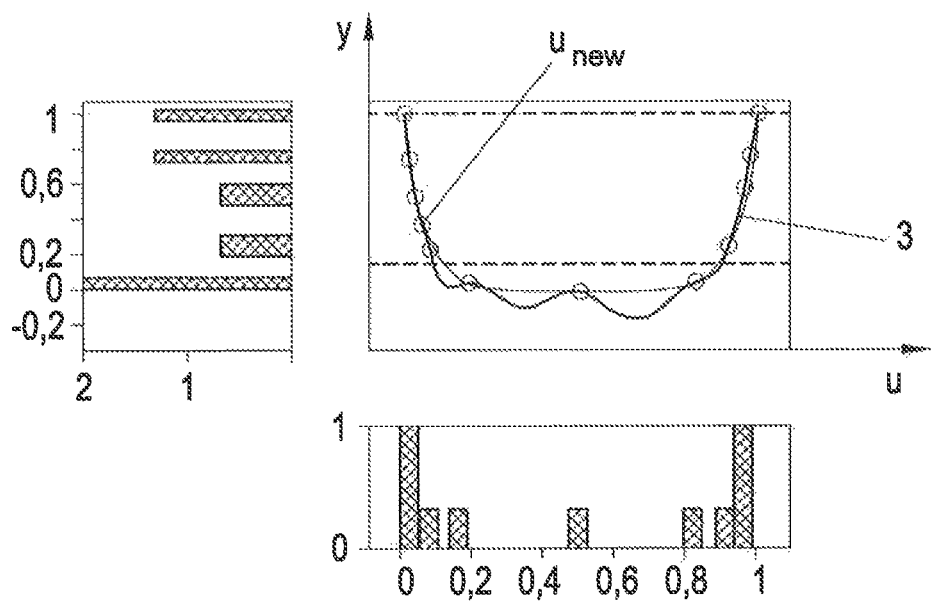
Figure 5:
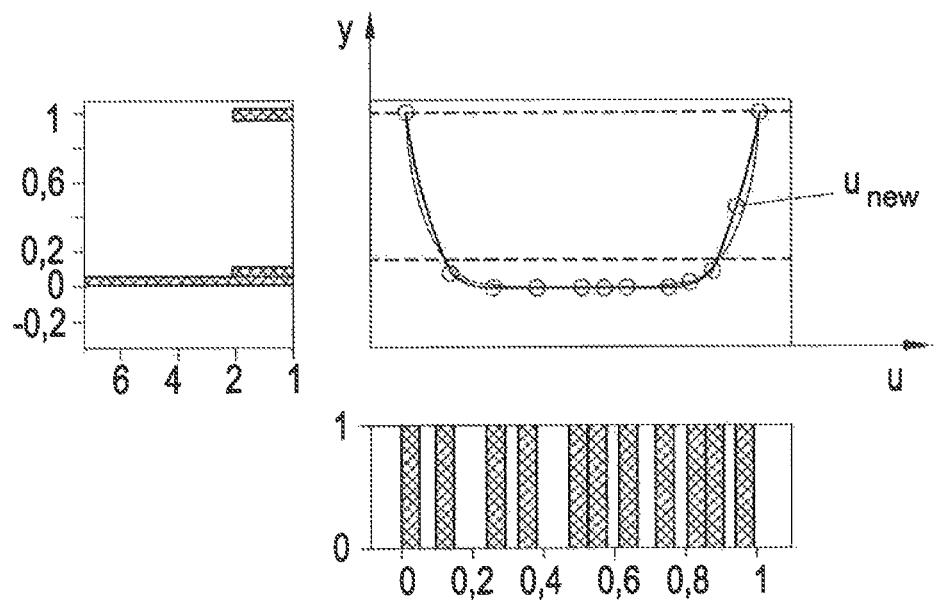
Figure 6:
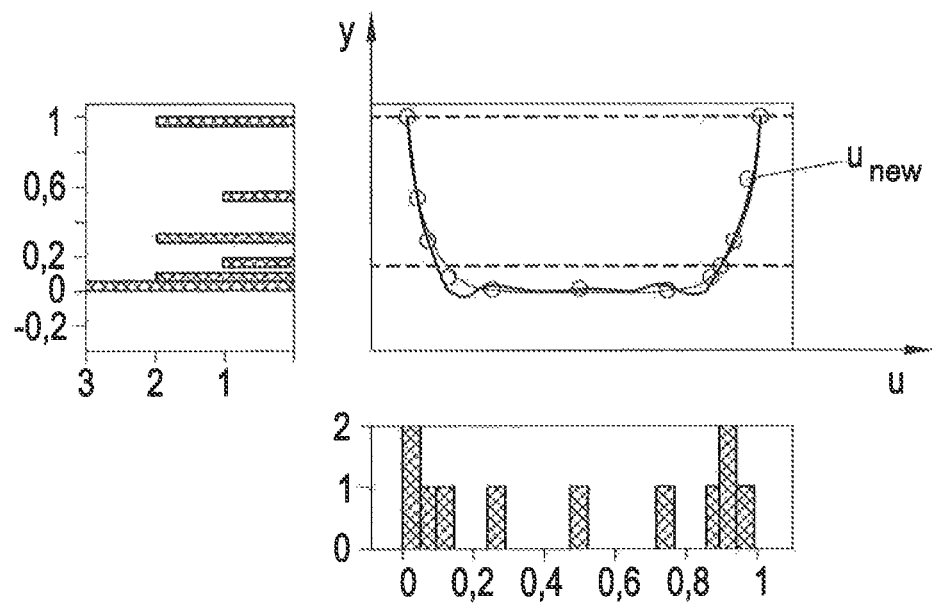
Figure 7:
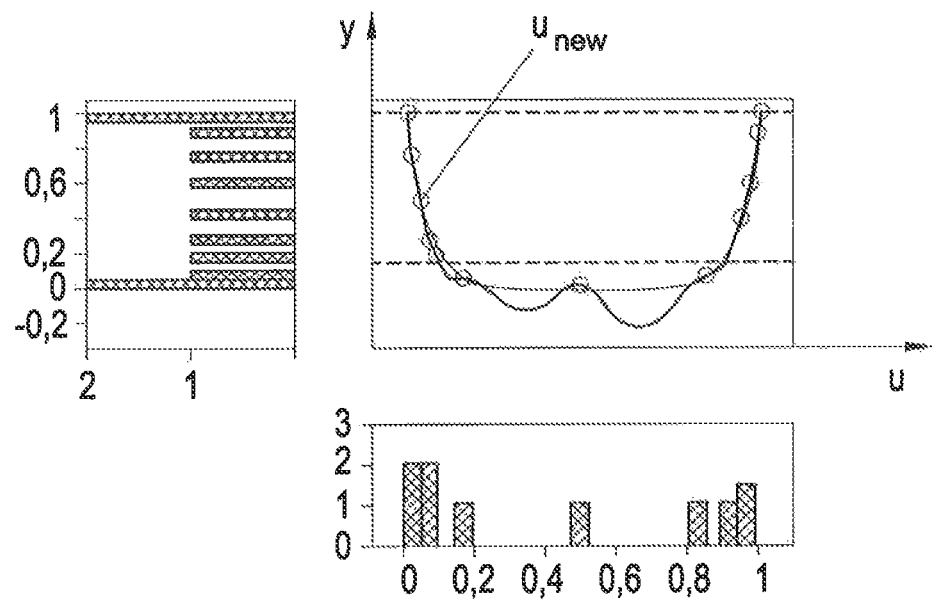
Figure 8:
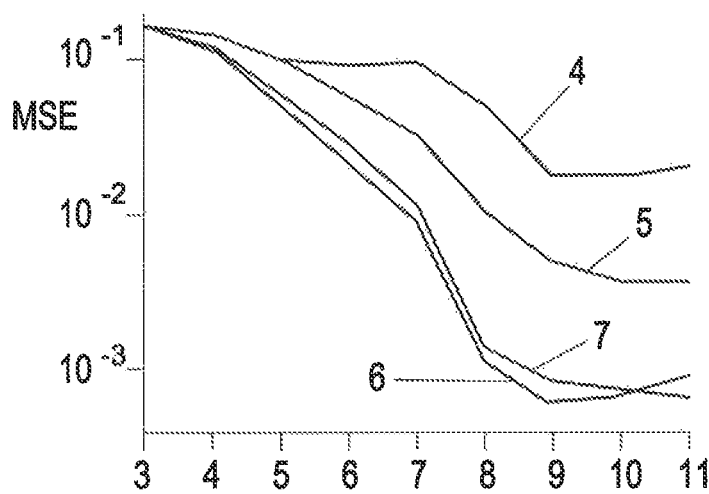
Figure 9:
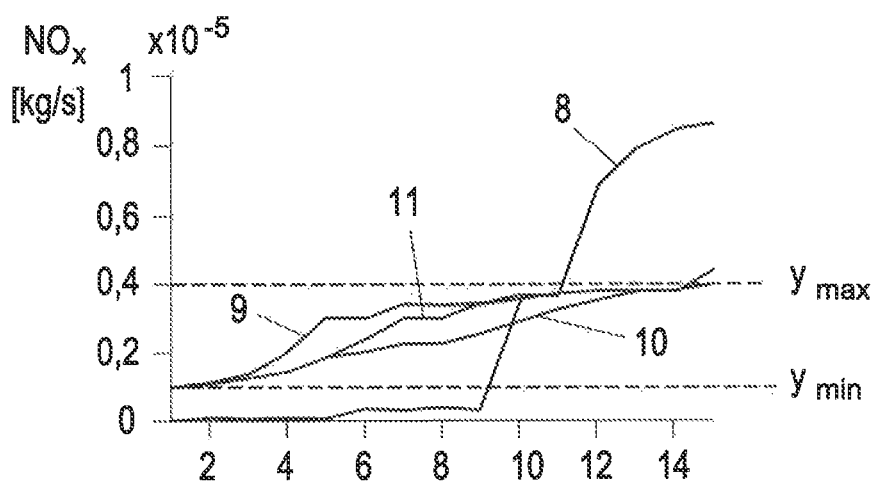
Figure 10:
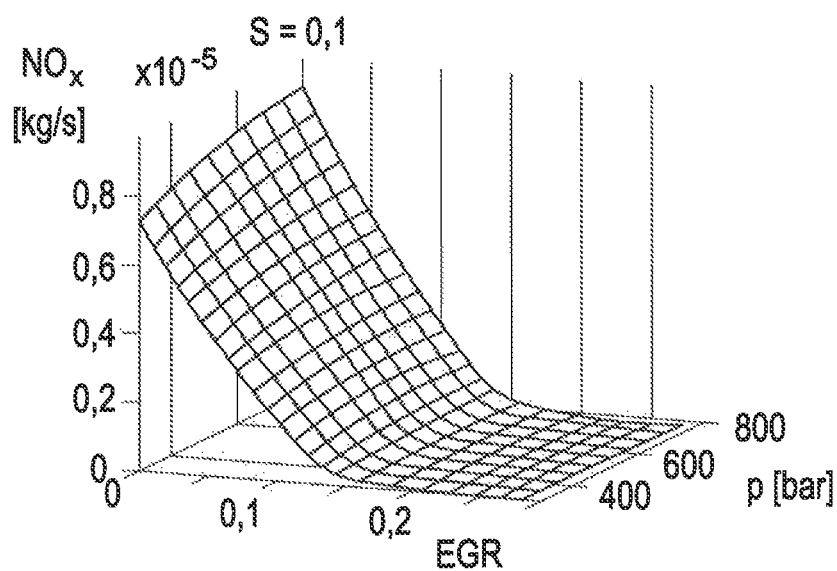

FIG. 1 shows a schematic view of the sequence of the method according to the invention, FIGS. 2 to 4 show various iteration steps of the method according to the invention for a distance-based selection criterion in the input/output quantity range, FIGS. 5 to 7 show a comparison of the different selection criteria with a conventional method for model identification, FIG. 8 shows a comparison of the mean squared errors when applying the various selection criteria and a conventional method for model identification, and FIGS. 9 and 10 show the use of the method according to the invention for the determination of a model for the $NO_x$ emissions of a combustion engine.

For the method according to the invention, a model must first be selected having a model structure with which the behavior of the technical system for a characteristic or output quantities as a function of certain input quantities is to be estimated. The following description of the method is based on the use of a known so-called local mode network (LMN). It should be noted, however, that the method can also be implemented in like manner with other known model structures, such as multilayer perceptrons, support vector machines or Gaussian processes, for example. However, a local model network is characterized by low computing time, the possibility of using existing knowledge of the technical system, and by model parameters that can be robustly used for the experimental design, therefore the local model network LMN being particularly suited for the method according to the invention, for which reasons the invention is described below using a local model network LMN as the model structure.

A local model network LMN consists of I local models $\hat{y}_j(u;\vartheta_j)$ that are valid only locally, that is, only for certain input quantities. u refers to the n-dimensional input quantity vector of the technical system that contains all input quantities, and $\vartheta$ to the model parameter of the j-th local model. Here, the local models $\hat{y}_j(u;\vartheta_j)$ are squared multiple-regression models with interaction terms, although it should be noted that other model structures can also be used for the local models, such as linear or cubic multiple-regression models. The output of the local model network $\hat{y}(u)$ is the weighted sum of the outputs of the local models $\hat{y}_j(u;\vartheta_j)$ and is an estimated value for the system output. For this purpose, a validity function $\Phi_j(\tilde{x})$ is defined which establishes the validity range of the local models $\hat{y}_j(u;\vartheta_j)$, with $\tilde{x}$ referring to selected input quantities of the input quantity vector u. The output of the local model network $\hat{y}(u)$ is given in a known manner by $$\hat{y}(u) = \sum_{j=1}^{I} \Phi_j(x)\hat{y}_j(u;\vartheta_j).$$

The local model network LMN requires training data in order to estimate the relationship between input quantities u and the output quantity y of the technical system. As a result of the training in a training unit 2, it is possible to determine, in addition to the model parameters $\varepsilon_j$, the number I of local models $\hat{y}_j(u;\vartheta_j)$ as well and their validity functions $\phi_j(\tilde{x})$.

This is sufficiently known per se, for example from Hametner, C., et al., "Local model network identification for online engine modelling," 2013, Information Sciences 220 (0), p. 210-225, so it will not be discussed further here. The training data originate from an experimental design that is prepared as described below with reference to FIG. 1.

The point of departure is that the model need not be estimated precisely over the entire possible output quantity range, but only in a defined target output quantity range. For example, combustion engines are to be calibrated such that certain output quantities, such as $NO_x$ or soot emissions, for example, meet certain specifications for certain input quantities. The target output quantity range is thus known, but the associated input quantities of the model are not. An experimental design is therefore required which identifies these input quantities and parameterizes the model parameters $\vartheta_j$, the model, and optionally also the number I of local models and their validity functions, for the target output quantity range.

An experimental design is to be understood as a sequence, possibly also a time-sequence, of input quantities that are set on the test bench of the technical system, upon which the desired output quantity of the technical system is observed and measured. The technical system, e.g., a combustion engine, is arranged on the test bench, e.g., an engine test bench, optionally connected to a load machine, e.g., an electrical dynamometer, and the test bench and the technical system and the load machine are controlled according to the experimental design.

The experimental design is based on an iterative selection of input quantity vectors $u_{cand}$ from a set of input quantity vectors $U_{cand}$. Any set of possible input quantity vectors $u_{cand}$ that covers the entire input quantity range as uniformly as possible can be used as the set of input quantity vectors $U_{cand}$. The set of input quantity vectors $U_{cand}$ is set in advance and assumed to be known for the method.

An input quantity vector $u_{cand}$ can be used only once for the experimental design. At the beginning of the method, a set $U_{start}$ of input quantity vector $u_{start}$ is predetermined. So, in each iteration step, a new input quantity vector $u_{new}$ is first selected from the sets of input quantity vectors $U_{new}$ and then from the set of input quantity vectors $U_{cand}$, and the reaction of the technical system to this input quantity vector $u_{new}$ in the form of an output quantity $y_{new}$ is measured for the technical system by means of a bench test on a test bench 1. The set $U_{app}$ of already known or selected input quantity vector $u_{app}$ (including the new input quantity vector $u_{new}$) and the set $Y_{app}$ of the associated measured output quantities $y_{app}$ constitute the training data for the training of the local model network LMN in the training unit 2 (e.g., a suitable computer with software and implemented algorithms for executing the training). In each iteration step k, the local model network LMN is thus trained with these training data. However, the training can also only bring about a change in the local model network LMN in some iteration steps, e.g., the network dimension I or the model parameter $\vartheta_j$. When the model changes, the model parameters $\vartheta_j$, and optionally also the number I of the local models $\hat{y}_j(u;\vartheta_j)$ and their validity functions $\phi_j(\tilde{x})$, are updated according to the rules of the local model network LMN, such as described, for example, in Hametner, C., et al., "Local model network identification for online engine modelling," 2013, Information Sciences 220 (0), p. 210-225.

As a result, the set $U_{app}$ of the already selected input quantity vectors $u_{app}$ and the set $Y_{app}$ of the associated measured output quantities $y_{app}$ grows continuously until a sufficiently precise model $LMN_{fin}$ has been achieved for the target output range. This can be determined by means of an appropriate abort criterion, for example a maximum quantity of training data or a threshold value below which the mean squared model error must be in the target output range. The selection of the new input quantity vector $u_{new}$ is done according to the following method.

First, the output quantities $\hat{y}(u_{cand})$ estimated by the current model are determined for the set of input quantity vectors $U_{cand}$ by means of the current local model network LMN in the respective iteration step k. After that, all of the input quantity vectors $u_{cand,COR}$ whose estimated output quantities $\hat{y}_{cand,COR}$ lie in the target output quantity range (custom output range, COR) defined by its limits $y_{min}$ and $y_{max}$ are determined from that, and these are grouped together in the set of target input quantity vectors $U_{cand,COR}$.

$$U_{cand,COR} = \{u_{cand} \in U_{cand} | y_{min} \leq \hat{y}(U_{cand}) \leq y_{max}\}$$

From this set of target input quantity vectors $U_{cand,COR}$, the new input quantity vector $u_{new}$ is now selected in each iteration step k. Objective here is a distribution in the input quantity range, output quantity range or input/output quantity range that is as uniform as possible. The reason for this is that the local model network LMN, or generally the model, is more precise in the vicinity of the training data than further away from the training data. If the training data are distributed as uniformly as possible, the model uncertainty is thus reduced. For this reason, a distance-based selection criterion (also known as an S-optimal design or maximum distance design) is used for the selection of the new input quantity vector $u_{new}$. It is the goal of the distance-based selection criterion to maximize the minimum distance between design points (here input quantity and/or output quantity). To do this, three distance-based selection criteria can now be defined:

Distance-Based Selection Criterion in the Input Quantity Range:

The input quantity vector $u_{cand,COR}$ is selected from the set of input quantity vectors $U_{cand,COR}$ that has the greatest possible minimum Euclidean distance to the already known input quantity vectors $u_{app}$ in the set $U_{app}$, for which the following thus applies:

$$u_{new} = \underset{u_{cand,COR} \in U_{cand,COR}}{\arg\max} \underset{u_{app} \in U_{app}}{\min} \sqrt{(u_{app} - u_{cand,COR})^T (u_{app} - u_{cand,COR})}.$$

This criterion leads to a uniform distribution of the selected input quantity vectors in the input quantity range.

Distance-Based Selection Criterion in the Output Quantity Range:

First, the output quantities $\hat{y}(u_{cand,COR})$ are calculated from the currently valid model for the set of input quantity vectors $U_{cand,COR}$. The new input quantity vector $u_{new}$ has the output quantity $$\hat{y}_{new} = \underset{\hat{y}_{cand,COR} \in \hat{y}(U_{cand,COR})}{\arg\max} \underset{y_{app} \in Y_{app}}{\min} \sqrt{(y_{app} - \hat{y}_{cand,COR})^2},$$

i.e., the output quantity having the greatest possible minimum Euclidean distance to the already known output quantities, and the associated new input quantity vector $u_{new}$ is then obtained from $$u_{new} = \{u_{cand,COR} \in U_{cand,COR} | \hat{y}(u_{cand,COR}) = \hat{y}_{new}\}$$

This criterion leads to a uniform distribution of the output quantities in the target output quantity range.

Distance-Based Selection Criterion in the Input/Output Quantity Range:

Here, the set of already selected input quantity vectors $U_{app}$ is supplemented with the associated output quantities $Y_{app}$, $U^*_{app} = [U_{app}\ Y_{app}]$, and the set of input quantity vectors $U_{cand,COR}$ is supplemented with the associated estimated output quantities $\hat{y}(U_{cand,COR})$, $U_{cand,*COR} = [U_{cand,COR}\ \hat{y}(U_{cand,COR})]$. The new input quantity vector $u_{new}$ then follows from the criterion $$[u_{new}\ \hat{y}(u_{new})] = \underset{u^*_{cand,COR} \in U^*_{cand,COR}}{\arg\max} \underset{u^*_{app} \in U^*_{app}}{\min} \sqrt{(u^*_{app} - u^*_{cand,COR})^T (u^*_{app} - u^*_{cand,COR})}.$$

What is thus being sought here is the input quantity with the greatest possible minimum Euclidean distance to the already known input quantities and the greatest possible minimum Euclidean distance of the associated output quantity to the already known output quantities. This criterion leads to a uniform distribution of the input quantities in the input quantity range and of the output quantities in the target output quantity range.

The local model network $LMN_{fin}$ trained in this way is then capable of estimating the output y of the technical system within a target output quantity range with the desired accuracy (predetermined by the selected abort criterion). The trained model network LMN can then be used, for example, for the development of the technical system, e.g., in order to calibrate control units of a combustion engine such that predetermined threshold values are adhered to for the output quantity.

The method according to the invention will now be demonstrated with reference to FIGS. 2 to 4 on the basis of a bathtub-like function f (y=f(u)), which is dependent on a one-dimensional input quantity u, and on the basis of a distance-based selection criterion in the input/output quantity range. This function f exhibits a strongly nonlinear behavior in the input quantity ranges u=[0; 0.2] and u=[0.8; 1] and is almost linear in the input quantity range u=[0.2; 0.8]. The target output quantity range in which the model (a local model network LMN) is to be parameterized with sufficient accuracy is defined by $y_{min}=0.15$ and $y_{max}=1$ for the example. The curve 3 in FIG. 2 shows the initial model with three selected initial input quantities $u_{start}$ in the set $U_{app}$. The two broken lines mark the target output quantity range. The frequency of the points in the input and output range is depicted in the form of bars for each axis. The new input quantity $u_{new}$ determined using the method is also shown in FIG. 2. FIG. 3 shows the model after the selection of seven input quantities in the set $U_{app}$ and the reaction of the current model in the form of output quantities $y_{app}$. FIG. 4 shows the model after the selection of eleven input quantities in set $U_{app}$, whereby the process is stopped (the new input quantity $u_{new}$ is no longer taken into account). It can be seen from FIGS. 2 to 4 that the method systematically parameterizes the model in the defined target output quantity range, whereby the model is very accurate within this range but inaccurate outside of it. The frequency distributions also reveal a very uniform distribution of the points in the input and output range in the relevant target output range (according to the selected selection criterion). Moreover, it can be seen that the method is capable of covering both branches of the output function in equal measure.

In FIGS. 5 to 7, the various distance-based selection criteria after eleven selected input quantities are compared with one another. FIG. 5 shows the result using a method according to the prior art without target output quantity range. It can be seen that, while the input quantities are distributed very uniformly, no input quantity with output quantity was parameterized in the target output range, so the model is unusable in the target output quantity range. In FIG. 6, a distance-based selection criterion as described above is applied in the input quantity range, which leads to the selection of four input quantities with output quantity in the target output quantity range. In FIG. 7, a distance-based selection criterion as described above is applied in the output quantity range, which leads to the selection of six input quantities with output quantity in the target output quantity range.

FIG. 8 additionally shows the mean squared error (MSE) of the various methods (on a logarithmic scale). Curve 4 shows the MSE for a method without target output quantity range, curve 6 shows the method with distance-based selection criterion in the input quantity range, curve 6 shows the method with distance-based selection criterion in the output quantity range, and curve 7 shows the method with distance-based selection criterion in the input/output quantity range. It is clear from these figures that a distance-based selection criterion with simultaneous consideration of a target output quantity range improves the model quality compared to a method without target output quantity range as a result of substantially smaller model errors. Quantitatively, a distance-based selection criterion in the input/output quantity range appears to be better than the other distance-based selection criteria.

A model-based experimental design with a target output quantity range is therefore an efficient method which parameterizes the model of the technical process in the target output quantity range in order to reduce the input quantity range, thus leading to improved model quality in the target output quantity range. At the same time, the number of bench tests required to achieve the same model quality is also reduced as a result.

The method according to the invention will also be explained below using a practical example in the form of the $NO_x$ emissions of a combustion engine (output quantity y) as a function of the input quantities position of the swirl flap (S), fuel pressure (p) and exhaust gas recirculation (EGR) (input quantity vector u) for a certain engine speed and a certain load. The target output quantity range is defined as $NO_x$ emissions in the range from $y_{min}=0.1\times10^{-5}$ kg/s and $y_{max}=0.4\times10^{-5}$ kg/s. The underlying model, here in the form of a local model network LMN, for example, is parameterized for the target output quantity range using the method according to the invention. As can be seen in FIG. 9, the output quantities are estimated by the method according to the invention in the target output quantity range by the model. Curve 8 shows the result of fifteen selected input quantities for a method without target output quantity range, curve 9 shows the result with distance-based selection criterion in the input quantity range, curve 10 shows the result with distance-based selection criterion in the output quantity range, and curve 11 shows the result with distance-based selection criterion in the input/output quantity range. Finally, FIG. 10 shows the $NO_x$ emissions estimated using the determined model for a constant position of the swirl flap S=0.1 and for a certain engine speed and a certain load.

The invention claimed is:

1. A method for determining a model for an output quantity of a technical system dependent, in a nonlinear manner, on a number of input quantities in the form of an input quantity vector, the method comprising:
   providing a model with a model structure and with model parameters; and
   iteratively repeating the following method steps until a predetermined abort criterion is met:
   determining a set of estimated output quantities with the model that is valid for a current iteration step from a set of input quantity vectors;
   identifying from the determined set of estimated output quantities the corresponding input quantity vectors of the set of input quantity vectors that lead to an estimated output quantity within a predetermined target output quantity range and using the such identified input quantity vectors as target input quantity vectors, which are collected in a set of target input quantity vectors;
   selecting a new input quantity vector from the set of target input quantity vectors, the new input quantity vector is selected on the basis of a predetermined distance-based selection criterion, and adding the selected new input quantity vector to a set of selected input quantity vectors;
   using the set of selected input quantity vectors as an experimental design for carrying out bench tests on a test bench with the technical system and measuring output quantities of the technical system on the test bench;
   optimizing the model using the measured output quantities; and
   using the model of a last iteration step as the model of the technical system to estimate the output quantity in the target output quantity range, wherein the target output quantity range is a subrange of an entire output quantity range.

2. The method as set forth in claim 1, wherein in the step of selecting the new input quantity vector from the set of target input quantity vectors the target input quantity vector with the greatest possible minimum Euclidean distance to the input quantity vectors in the set of selected input quantity vectors is selected.

3. The method as set forth in claim 1, further including calculating the output quantities for the set of target input quantity vectors using the model for a present iteration step, and selecting the input quantity vector whose calculated output quantity has the greatest possible minimum Euclidean distance to already known output quantities as the new input quantity vector.

4. The method as set forth in claim 1, wherein the set of selected input quantity vectors is supplemented by the associated output quantities and the set of target input quantity vectors is supplemented by the associated output quantities calculated with the model for a present iteration step; and selecting the input quantity vector that has the greatest possible minimum Euclidean distance to the input quantity vectors in the set of selected input quantity vectors and whose associated output quantity has the greatest possible minimum Euclidean distance to already known output quantities as the new input quantity vector.

5. The method as set forth in claim 1, wherein a local model network with a number of local models with model parameters and associated validity functions is used as the model and, in an iteration step, the number of local models, the model parameters and/or the associated validity functions are adapted on the basis of the selected input quantities and the measured output quantities.

6. The method as set forth in claim 1, wherein the determined model is applied to and improves one or more performance characteristics of a combustion engine or an automobile.

7. The method as set forth in claim 1, wherein the determined model is used in the development of the technical system.

8. The method as set forth in claim 7, wherein the determined model is used to optimize at least one output quantity of the technical system.

9. The method as set forth in claim 8, wherein the optimization is verified on a test bench with the technical system.

10. A method for determining a model for an output quantity of a technical system dependent, in a nonlinear manner, on a number of input quantities in the form of an input quantity vector, the method comprising:
providing a model with a model structure and with model parameters; and
iteratively repeating the following method steps until a predetermined abort criterion is met:
determining a set of estimated output quantities with the model that is valid for a current iteration step from a set of input quantity vectors;
identifying from the determined set of estimated output quantities the corresponding input quantity vectors of the set of input quantity vectors that lead to an estimated output quantity within a predetermined target output quantity range and using the such identified input quantity vectors as target input quantity vectors, which are collected in a set of target input quantity vectors;
selecting a new input quantity vector from the set of target input quantity vectors, the new input quantity vector is selected on the basis of a predetermined distance-based selection criterion, and adding the selected new input quantity vector to a set of selected input quantity vectors;
using the set of selected input quantity vectors as an experimental design for carrying out bench tests on a test bench with the technical system and measuring output quantities of the technical system on the test bench;
optimizing the model using the measured output quantities;
using the model of a last iteration step as the model of the technical system to estimate the output quantity in the target output quantity range, wherein the target output quantity range is a subrange of an entire output quantity range; and
wherein the determined model is applied to and improves one or more performance characteristics of a combustion engine or an automobile.

11. The method of claim 10, wherein in the step of selecting the new input quantity vector from the set of target input quantity vectors, the target input quantity vector with the greatest possible minimum Euclidean distance to the input quantity vectors in the set of selected input quantity vectors is selected.

12. The method of claim 10, further including calculating the output quantities for the set of target input quantity vectors using the model for a present iteration step, and selecting the input quantity vector whose calculated output quantity has the greatest possible minimum Euclidean distance to already known output quantities as the new input quantity vector.

13. The method of claim 10, wherein the set of selected input quantity vectors is supplemented by the associated output quantities and the set of target input quantity vectors is supplemented by the associated output quantities calculated with the model for a present iteration step; and selecting the input quantity vector that has the greatest possible minimum Euclidean distance to the input quantity vectors in the set of selected input quantity vectors and whose associated output quantity has the greatest possible minimum Euclidean distance to already known output quantities as the new input quantity vector.

14. The method of claim 10, wherein the determined model is used in the development of the technical system.

15. A method for determining a model for an output quantity of a technical system dependent, in a nonlinear manner, on a number of input quantities in the form of an input quantity vector, the method comprising:
providing a model with a model structure and with model parameters; and
iteratively repeating the following method steps until a predetermined abort criterion is met:
determining a set of estimated output quantities with the model that is valid for a current iteration step from a set of input quantity vectors;
identifying from the determined set of estimated output quantities the corresponding input quantity vectors of the set of input quantity vectors that lead to an estimated output quantity within a predetermined target output quantity range and using the such identified input quantity vectors as target input quantity vectors, which are collected in a set of target input quantity vectors;
selecting a new input quantity vector from the set of target input quantity vectors, the new input quantity vector is selected on the basis of a predetermined distance-based selection criterion, and adding the selected new input quantity vector to a set of selected input quantity vectors;
using the set of selected input quantity vectors as an experimental design for carrying out bench tests on a test bench with the technical system and measuring output quantities of the technical system on the test bench;
optimizing the model using the measured output quantities;
using the model of a last iteration step as the model of the technical system to estimate the output quantity in the target output quantity range, wherein the target output quantity range is a subrange of an entire output quantity range; and
wherein the determined model is used in the development of the technical system.

16. The method of claim 15, wherein in the step of selecting the new input quantity vector from the set of target input quantity vectors, the target input quantity vector with the greatest possible minimum Euclidean distance to the input quantity vectors in the set of selected input quantity vectors is selected.

17. The method of claim 15, further including calculating the output quantities for the set of target input quantity vectors using the model for a present iteration step, and selecting the input quantity vector whose calculated output quantity has the greatest possible minimum Euclidean distance to already known output quantities as the new input quantity vector.

18. The method of claim 15, wherein the set of selected input quantity vectors is supplemented by the associated output quantities and the set of target input quantity vectors is supplemented by the associated output quantities calculated with the model for a present iteration step; and selecting the input quantity vector that has the greatest possible minimum Euclidean distance to the input quantity vectors in the set of selected input quantity vectors and whose associated output quantity has the greatest possible minimum Euclidean distance to already known output quantities as the new input quantity vector.

19. The method of claim 15, wherein the determined model is applied to and improves one or more performance characteristics of a combustion engine or an automobile.

\* \* \* \* \*